(12) United States Patent
Ring

(10) Patent No.: US 6,565,720 B1
(45) Date of Patent: *May 20, 2003

(54) SUBSTRATE REMOVAL AS A FUNCTION OF SPUTTERED IONS

(75) Inventor: Rosalinda M. Ring, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 72 days.

This patent is subject to a terminal disclaimer.

(21) Appl. No.: 09/583,415

(22) Filed: May 31, 2000

(51) Int. Cl.[7] .............................................. C23C 14/32
(52) U.S. Cl. .......................... 204/192.34; 204/192.32; 204/192.37; 204/298.36; 438/4; 438/5; 438/15; 438/108; 250/307; 250/309; 250/492.21; 250/492.3
(58) Field of Search ..................... 204/192.32, 192.34, 204/298.36, 192.37; 438/4, 5, 15, 108; 250/307, 309, 492.21, 492.3

(56) References Cited

U.S. PATENT DOCUMENTS

| | | | |
|---|---|---|---|
| 4,609,809 A | * 9/1986 | Yamaguchi et al. ... | 204/192.34 |
| 5,476,819 A | * 12/1995 | Warren ........................ | 438/456 |
| 5,952,658 A | * 9/1999 | Shimase et al. ............ | 250/309 |
| 6,281,025 B1 | * 8/2001 | Ring et al. ..................... | 438/10 |

* cited by examiner

Primary Examiner—Rodney G. McDonald

(57) ABSTRACT

Substrate removal from a semiconductor chip having silicon-on-oxide (SOI) structure is enhanced via a method and system that provide a control for the removal process. According to an example embodiment of the present invention, a portion of substrate is removed from the back side of a semiconductor chip having a SOI structure and a backside opposite a circuit side. As the substrate is removed, secondary ions are sputtered from the back side. The sputtered ions are detected, and the substrate removal is controlled as a function of detected ions. In this manner, the portion of the substrate being removed can be detected and used to enhance the control of the substrate removal process, such as by detecting sputtered ions from the insulating portion of the SOI and using the insulating portion as an endpoint of the substrate removal process.

30 Claims, 4 Drawing Sheets

SUBSTRATE REMOVAL AS A FUNCTION OF SPUTTERED IONS

FIELD OF THE INVENTION

The present invention relates generally to semiconductor chips and their fabrication and, more particularly, to analysis of semiconductor chips involving substrate removal.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

To increase the number of pad sites available for a die, to reduce the electrical path to the pad sites, and to address other problems, various chip-packaging techniques have been developed. One of these techniques is referred to as controlled collapse chip connection or flip-chip packaging. With packaging technology, bonding pads of the die include metal (solder) bumps. Electrical connection to the package is made when the die is flipped over and soldered to the package. Each bump connects to a corresponding package inner lead. The resulting packages are low profile and have low electrical resistance and a short electrical path. The output terminals of the package, which are sometimes ball-shaped conductive bump contacts, are typically disposed in a rectangular array. These packages are occasionally referred to as Ball Grid Array (BGA) packages. Alternatively, the output terminals of the package may be pins and such packages are commonly known as pin grid array (PGA) packages.

Once the die is attached to such a package the back side portion of the die remains exposed. The transistors and other circuitry are generally formed in a very thin epitaxially grown silicon layer on a single crystal silicon wafer from which the die is singulated. The side of the die including the epitaxial layer containing the transistors and other circuitry is often referred to as the circuit side or front side of the die. The circuit side of the die is positioned very near the package and opposes the back side of the die. Between the back side and the circuit side of the die is single crystalline silicon.

The positioning of the circuit side near the package provides many of the advantages of the flip chip. However, in some instances orienting the die with the circuit side face down on a substrate is disadvantageous. Due to this orientation of the die, the transistors and circuitry near the circuit side are not directly accessible for testing, modification or other purposes. Therefore, access to the transistors and circuitry near the circuit side is from the back side of the chip.

Techniques have been developed to access the circuit even though the integrated circuit (IC) is buried under the bulk silicon. For example, near-infrared (nIR) microscopy is capable of imaging the circuit because silicon is relatively transparent in these wavelengths of the radiation. To acquire these images, because of the absorption losses of IR radiation in silicon, it is generally required to thin the die to less than 100 microns. For example, on a die that is 725 microns thick, at least 625 microns of silicon is typically removed before IR microscopy can be used. Thinning the die for failure analysis of a flip chip bonded IC is usually accomplished by first thinning the die across the whole die surface, often referred to as global thinning. Mechanical polishing, such as chemical-mechanical polishing (CMP), is one method for global thinning. Once an area is identified using IR microscopy as an area of interest and it is determined that access is needed to a particular area of the circuit, local thinning techniques are often used to thin an area smaller than the die size.

During failure analysis, or for design debug, it is sometimes desirable to make electrical contact and probe certain circuit nodes on the circuit side or front side of a die, or to reconfigure the conductors in an integrated circuit. This access is generally done by milling through substrate to access the node, or milling to the node and subsequently depositing a metal to electrically access the node. Often, global and local thinning as described above are used to accomplish such milling.

Accurate determination of the thickness of the silicon in the back side, however, is not readily achieved, making the milling process difficult to control. When not controlled properly, substrate removal can result in damage to or destruction of circuitry and other substrate in the device. It is desirable to have the ability to determine the progression of the removal process including detecting the endpoint with sufficient accuracy to avoid such damage or destruction, which could often jeopardize further device analysis.

SUMMARY OF THE INVENTION

The present invention is directed to a method and system for analyzing a semiconductor chip having silicon-on-insulator (SOI) structure and a back side opposite a circuit side. The chip analysis includes controllably removing substrate from the chip, and is exemplified in a number of implementations and applications, some of which are summarized below.

According to an example embodiment of the present invention, substrate is removed from a semiconductor chip having silicon-on-insulator (SOI) structure and a back side opposite circuitry near a circuit side. A portion of substrate in the back side of the semiconductor chip is removed as a function of a detected selected substrate material that is sputtered from a region of the substrate.

According to another example embodiment of the present invention, substrate is removed from a semiconductor chip having SOI structure and a back side opposite a circuit side. An ion beam is directed at a portion of substrate in the back side of the chip and ions are sputtered from the substrate, thereby removing substrate and forming an aperture in the back side. The concentration of sputtered ions is detected and, in response to the concentration of the detected sputtered ions reaching a threshold level, the substrate removal rate is adjusted. When the concentration of the detected sputtered ions reaches a threshold level corresponding to reaching an endpoint of the substrate removal process, the removal process is terminated.

According to another example embodiment of the present invention, a system is arranged for removing substrate from a semiconductor chip having silicon-on-insulator (SOI)

structure and a back side opposite a circuit side. A substrate removal arrangement is adapted to remove substrate from and form an aperture in the back side of the semiconductor chip. Secondary ions emitted from the back side as the aperture is being formed are detected by a detection device and used by a controller adapted to control the substrate removal arrangement as a function of the detected secondary ion emission.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
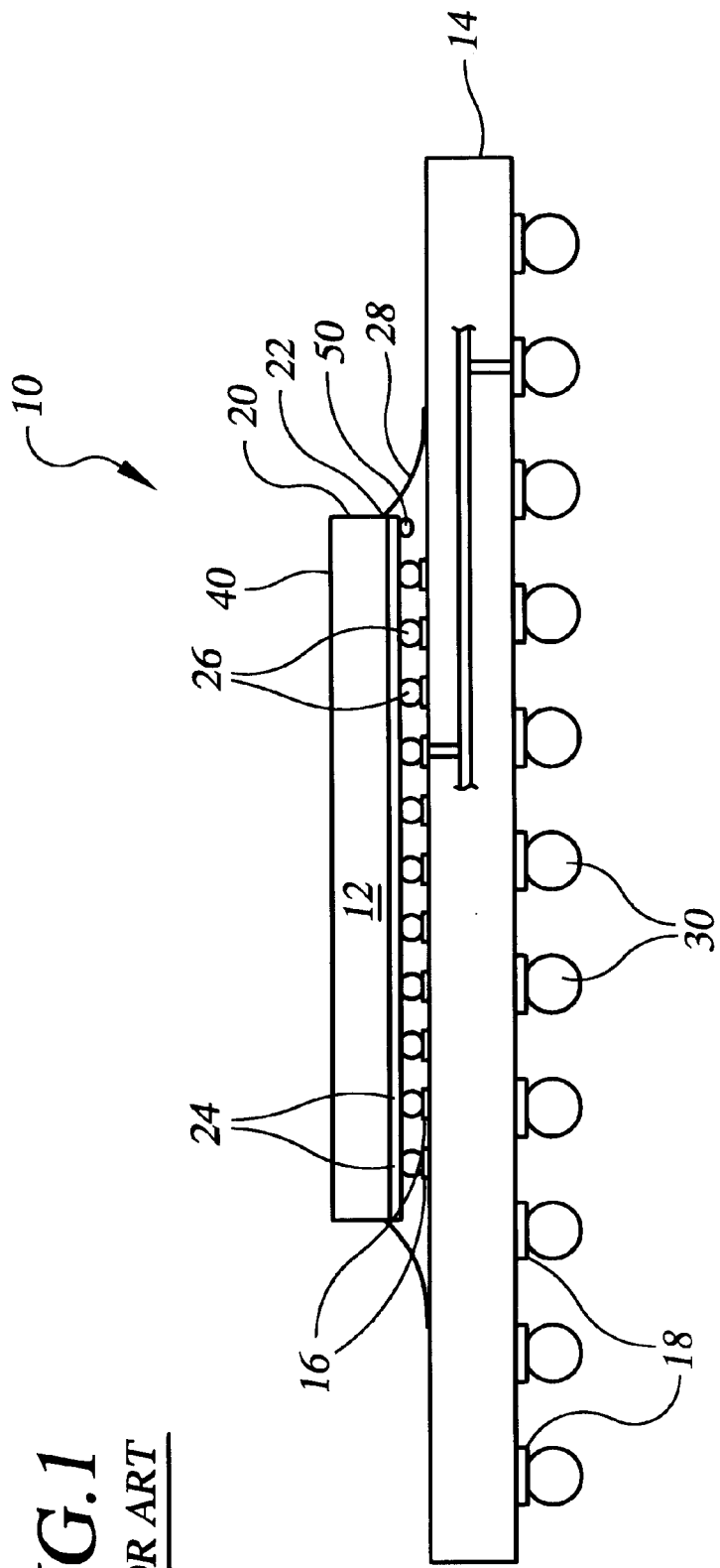
FIG. 1 is a flip-chip type semiconductor device for use in connection with the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and has been found to be particularly suited for flip-chip and other type devices requiring or benefiting from analysis involving substrate removal, such as during post-manufacturing analysis. While the present invention is not necessarily limited to such devices, various aspects of the invention may be appreciated through a discussion of various examples using this context.

According to an example embodiment of the present invention, substrate is removed from the back side of a semiconductor chip. As the substrate is being removed, secondary ions are sputtered from a portion of the chip and are detected using a method such as secondary ion mass spectrometry (SIMS). The detected ions are analyzed to determine a characteristic of the material being sputtered from the substrate. Characteristics including the chemical composition and the dopant concentration of the sputtered material vary according to the type of chip and the region of the chip being sputtered. This variation can be determined for a particular type of chip and used as a reference. The reference characteristics are used in connection with the characteristic determined from the chip being sputtered to determine the progression of the substrate removal process. The determined progression of the substrate removal process is used to accelerate, decelerate, stop, or otherwise control the substrate removal process.

The determined characteristic of the sputtered material can be used in connection with the reference characteristics in several manners. Typical semiconductor chips include layers having different types of material and/or material having varying dopant concentrations. When the material is sputtered it can be analyzed to determine what layer is being sputtered, and the progression of the removal process can be determined therefrom. For instance, when a chip having silicon on insulator construction is etched with an ion beam, the silicon portion is sputtered before the oxide is sputtered. Once the silicon portion is removed and the oxide is exposed, the ion beam begins to sputter the oxide. By monitoring the type of material being sputtered, one can determine when the oxide has been reached and use that determination to control the substrate removal process. When it is desired to stop etching at the oxide, the detection of the transition of material being sputtered from silicon to oxide can be used as an endpoint detection of the substrate removal process.

According to another example embodiment of the present invention, other characteristics such as dopant concentration can be used to control substrate removal from a chip. Using a chip having SOI structure as an example, a reference dopant concentration profile of the substrate is determined from a test chip or from manufacturing specifications. Substrate is removed from the chip and the dopant concentration of material sputtered from the chip is determined using SIMS. The concentration is compared to the reference concentration profile and used to determine the progression of the substrate removal.

FIG. 1 shows a side view of an assembly 10 of one type of conventional flip chip type die 12 assembled to a package substrate 14, suitable for use in connection with the present invention. Flip chip die 12 has a circuit side 50 and a back side 40. The circuit side 50 includes a number of circuit devices formed near the circuit side in a portion of the die known as the epitaxial layer 22. The epitaxial layer 22 has a thickness in the range of 1 to 15 microns. The portion of the die shown above the epitaxial layer is known as the bulk layer 20. A plurality of solder bumps 26 are made on the circuit side 50 at pads 24. The solder bumps 26 are the inputs and outputs to the circuitry associated with the die 12.

The flip chip type die 12 is attached to package substrate 14, such as a package for a flip chip via the solder bumps on the die 12. The package substrate 14 includes pads 16 that are arranged to correspond to the pattern of solder bumps on the die 12. The region between integrated circuit 12 and package substrate 14 is filled with an under-fill material 28 to encapsulate the solder bump connections and provide additional mechanical benefits. The pads 16 are coupled via circuitry to pads 18 on the package substrate. Solder bumps 30 are formed on the pads 18. The solder bumps 30 are the inputs and outputs to the circuitry associated with the package substrate 14. In another arrangement (not illustrated), the inputs and outputs to the circuitry associated with the package substrate 14 are implemented as pins rather than solder bumps.

Figure 2:
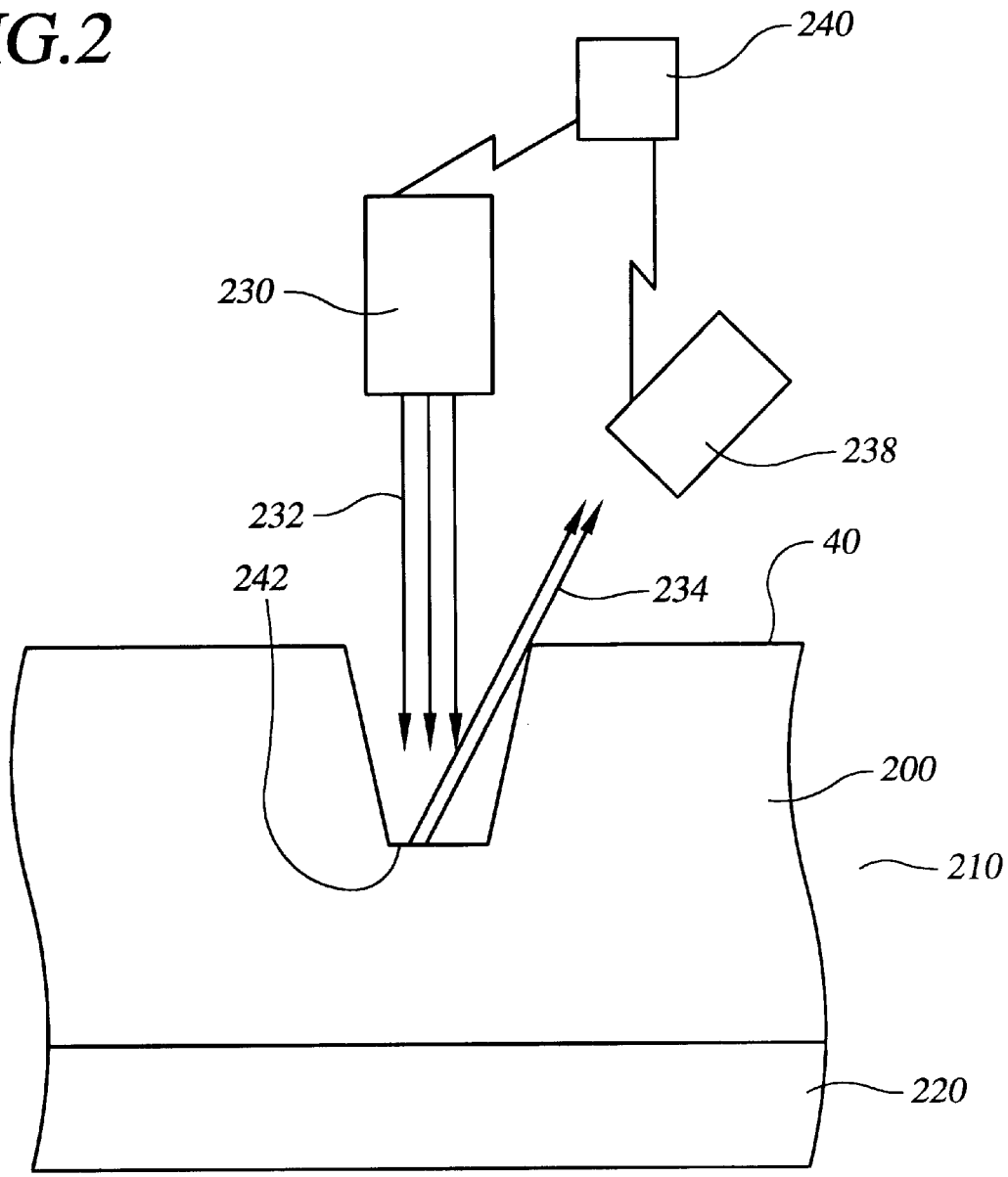
FIG. 2 is a semiconductor device undergoing analysis, according to an example embodiment of the present invention.

According to another example embodiment of the present invention, FIG. 2 shows a semiconductor device 210 having a back side layer 200 and a circuit side layer 220 undergoing post-manufacturing analysis. The semiconductor device 210 may, for example, be a flip chip device such as shown in FIG. 1, or another type of integrated circuit device. Device 210 is arranged with a back side surface 40 facing up. A focused ion beam (FIB) generating device 230 is positioned over the back side 40 and used to direct an ion beam 232 at the semiconductor device 210. Ion beam 232 mills an aperture or hole 242 in a back side layer 200 and secondary ions 234 are sputtered from the substrate. Secondary ions 234 are received by a mass spectrometer 238. The data collected from spectrometer 238 is processed by a computer arrangement 240 coupled to both the spectrometer 238 and to the FIB 230.

The FIB 230 includes a controller that is capable of controlling the ion beam 232 in response to a designated time or depth of the milling process. Once a desired depth in the silicon substrate is achieved, computer arrangement 240 sends a control signal to FIB 230 for controlling the milling process. For example, substrate removal rate may be reduced as the endpoint is neared by reducing the energy level of the ion beam, or the milling process may be terminated altogether when the endpoint is reached by stopping the application of the FIB.

The secondary ion detector 238 used in connection with the above example embodiments may, for example, include a SIMS device. SIMS characterizes dopant concentrations in two dimensions: at the surface of a particular region and also as a function of depth. The SIMS technique uses an ion beam (usually oxygen or cesium) to sputter away layers of the doped region. The sputtered dopant region produces ions that can then be mass analyzed. The sputtered ions are collected by a mass spectrometer for mass to charge separation and detection. The number of ions collected can also be digitally counted to produce quantitative data on the sample composition. SIMS primarily analyzes the material removed by sputtering from a sample surface. By monitoring the secondary ion signals with time, a depth profile can be produced. Sputter rates of 2–5 Å per second, at data acquisition time intervals of 10 seconds, produce typical depth increments in the 20–50 Å range. Usually the incident beam is rastered over a small area of the surface to create a hole or aperture with a nearly flat bottom. Mass analysis is only performed on the ionic fraction of sputtered material from the center of the hole.

In one example embodiment, Gallium (Ga+) ions are used to bombard the back side layer 200 and eventually mill the aperture 242. Gallium is used since its weight in atomic mass units is high, thereby serving as a good bombardment agent. Other elements can be used as bombardment agents depending on the energy level used and the substrate material to be detected by the ion detector and computer arrangement. The energy level of the ion beam is kept to about 1–50 keV in order to cause collisions with the atoms at the surface leading to their ejection. The size of the aperture of the FIB 230 or the ion beam current density, could also be changed to adjust the energy of the ion beam, which in turn changes the milling rate (i.e., substrate removal rate) of FIB 230 on the back side layer 200.

Figure 3:
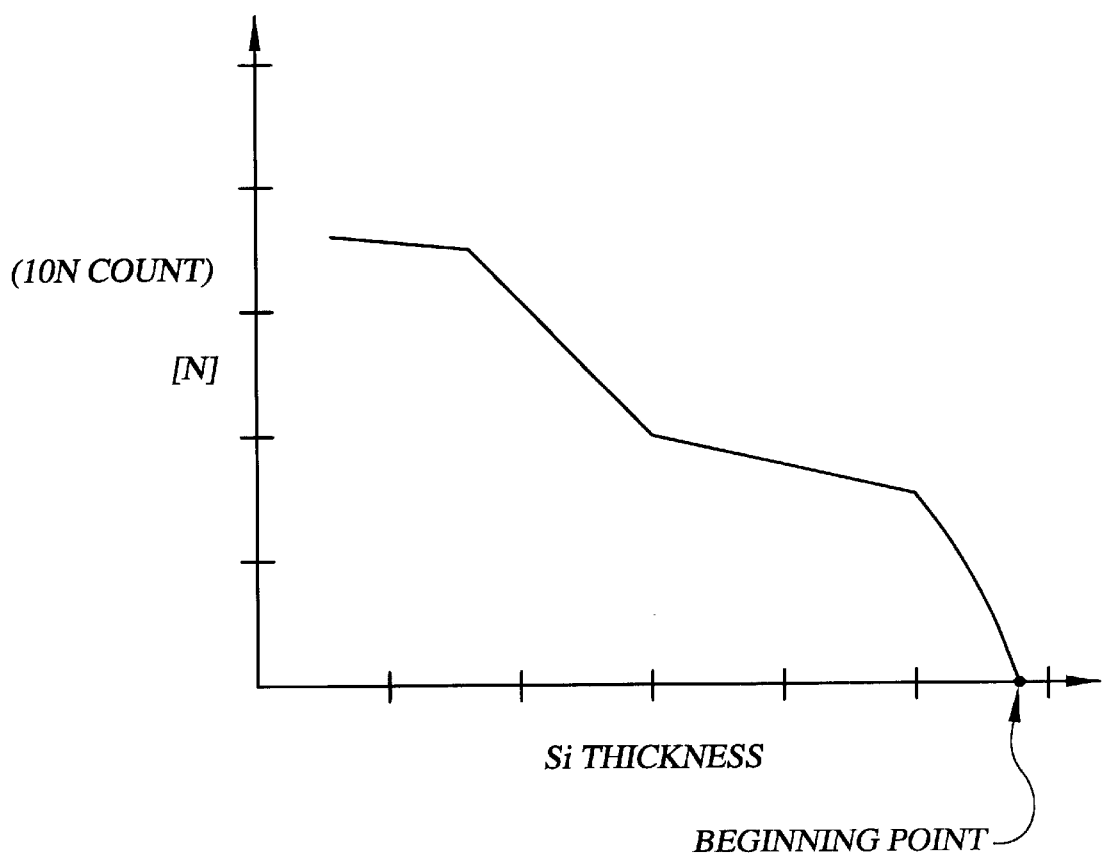
FIG. 3 is an example graph showing SIMS depth profile exhibiting ion concentrations versus silicon thickness, according to another example embodiment of the present invention.

According to another example embodiment of the present invention, FIG. 3 shows an ion count or concentration ([N]) versus silicon (Si) thickness calibration curve or look up table used to determine the remaining silicon thickness of a semiconductor chip being milled. Such a curve can be developed for a particular type of chip undergoing a particular type of process. The FIB/SIM discussed above is used in connection with the look-up table derived from the curve shown in FIG. 3 and is programmed to stop the process at a certain time. Note that for the particular embodiment shown by the curve in FIG. 3, the ion count detected increases as the milling progresses further into the substrate. The milling process is altered or stopped at a certain point (ion concentration level) on the [N]/Si thickness curve or when a certain element is detected, such as Phosphorus or Boron. The system also has the capability of detecting carrier concentration gradient or range of $10^{15}$ to $10^{20}$ carriers/cm$^3$.

Referring to FIGS. 2 and 3, as substrate is removed from back side layer 200, different dopant concentrations are detected as milling progresses through various portions of the substrate having diverse dopant concentrations. Computer arrangement 240 can be programmed to stop milling or alter the milling rate at any point desired as each portion is detected. For example, portions of substrate having diverse concentrations such as P+++ or P++ doping can be detected. As the milling progresses, the actual detected concentration data is fed back in the form of ion intensity (which correlates to concentration) to the computer 240 for comparison with a reference curve to determine the current status of the milling process.

In one example implementation, the concentration of the detected element is low at the highest value of silicon thickness (FIG. 3, Beginning Point). This is so because the substrate removal is started on the back side of the device and the thickness is reduced as the milling process nears the selected substrate material or desired concentration level. The original circuit designs can serve as the reference profiles that computer 240 can use when comparing actual detection data, received from a milling operation, to the reference profile.

Figure 4:
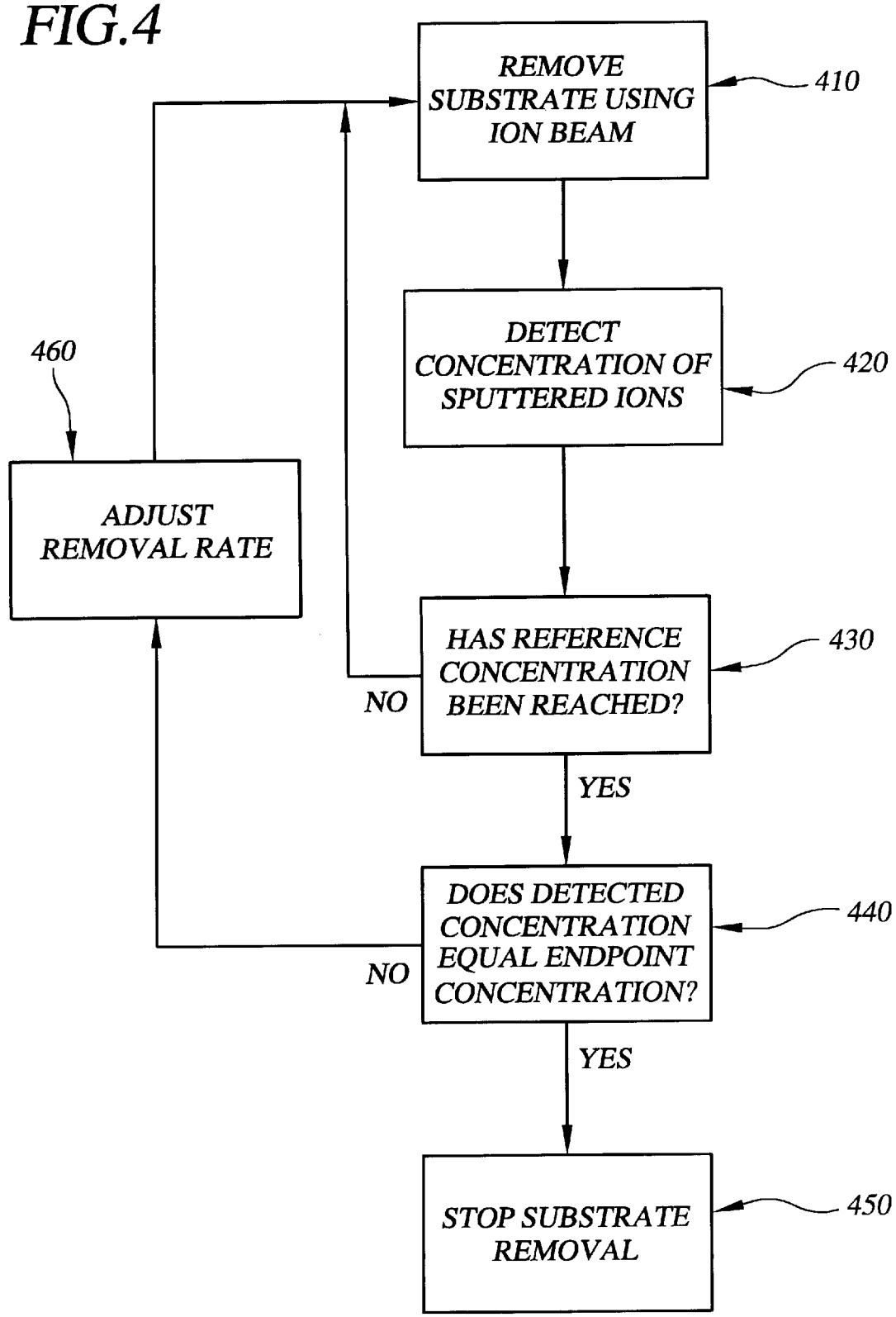
FIG. 4 is a flow chart for a method for post-manufacturing analysis of a semiconductor chip, according to another example embodiment of the present invention.

FIG. 4 is a flow chart for a method of removing substrate from a semiconductor device, according to another example embodiment of the present invention. An ion beam is directed at the chip and substrate is removed at block 410. The substrate removal can be accomplished using a device such as a focused ion beam (FIB) or other ion bombardment device that can be detected and identified by the SIMS technique. At block 420, ions sputtered from the substrate (thereby forming an aperture) are detected and used to determine the type of substrate material that is currently being sputtered by the ion beam. Comparing this information to the reference profile can then give an indication of the depth achieved so far by the etch process of the aperture within the substrate.

At block 430, it is determined if a reference concentration has been reached. A reference concentration may, for instance, be associated with a particular depth of substrate removal. If no reference concentration has been reached, the chip continues to be etched by the ion beam and the method continues at block 410. If a reference concentration has been reached, it is determined whether the endpoint of the removal process has been reached. If the endpoint has not been reached at block 440, the substrate removal process is adjusted according to the reference concentration reached and the method continues at block 410. One such reference point may include approaching the endpoint of the removal process. In response to approaching the endpoint, the substrate removal process is slowed so as not to exceed the endpoint when it is reached. When the detected concentration reached an endpoint concentration, the removal process is stopped at block 450.

The rate at which substrate is removed can be determined as a function of the semiconductor device's dopant diffusion profile (or concentration gradient) and the removal/detection process, and can be controlled to proceed at a speed that will remain non-destructive to other active elements in the device. For example, the determination of whether a reference concentration has been reached in block 430, or whether the concentration equals an endpoint concentration at block 440, could be performed by computer arrangement 240, shown in FIG. 2. Once the depth of substrate removal is determined the substrate removal rate can be controlled or the process terminated if the endpoint is reached.

SIMS is particularly useful in connection with the present invention because it is one of the few semiconductor characterization techniques that is capable of detecting all the elements and because it can identify the elements present in very low concentration levels. It is also one of the few surface analysis techniques that can measure doping level concentrations in electronic materials, and therefore is particularly useful for detecting the different doping levels as interfaces in the substrate are crossed. Overall, SIMS is an excellent tool for generating concentration profiles silicon dopants at levels including the $1 \times 10^{15}$ cm$^3$ range.

While the present invention has been described with reference to several particular example embodiments, those skilled in the art will recognize that many changes may be made thereto without departing from the spirit and scope of the present invention, which is set forth in the following claims.

What is claimed is:

1. A method for removing substrate from a semiconductor chip having silicon-on-insulator insulator (SOI) structure and a back side opposite circuitry near a circuit side, the method comprising removing a portion of substrate in the back side of the semiconductor chip as a function of a detected selected substrate material, including the insulating material of the SOI structure, that is sputtered from a region of the substrate.

2. The method of claim 1, wherein removing a portion of substrate in the back side of the semiconductor chip as a function of a detected selected substrate material that is sputtered from a region of the substrate includes detecting that the insulating layer of the SOI has been reached, the method further comprising stopping the substrate removal process in response to the detected sputtered material and when the sputtered region is within the insulating layer of the SOI structure.

3. The method of claim 1, wherein removing a portion of substrate in the back side of the semiconductor chip as a function of a detected selected substrate material that is sputtered from a region of the substrate comprises:

removing a portion of substrate from the back side of the semiconductor chip and forming an aperture in the back side;

detecting a concentration level of the selected substrate material as it is sputtered from the back side of the chip during substrate removal; and controlling the substrate removal as a function of the detected concentration level of the selected substrate material.

4. The method of claim 3, wherein removing a portion of the substrate includes directing an ion beam at a portion of the substrate and sputtering ions from the substrate.

5. The method of claim 3, wherein detecting a concentration level of the selected substrate material includes using an ion detector and detecting ions that are sputtered from the back side of the chip.

6. The method of claim 4, wherein the ion beam is comprised of gallium ions.

7. The method of claim 3, wherein controlling the substrate removal includes controlling responsive to detecting at least one of a predetermined element material and a dopant concentration level.

8. The method of claim 3, wherein controlling the substrate removal as a function of the detected concentration level of the selected substrate material comprises:

determining a reference concentration level of sputtered selected substrate material; and comparing the detected concentration level of the sputtered selected substrate material to the reference concentration level and controlling therefrom the substrate removal.

9. The method of claim 8, wherein removing a portion of substrate from the back side includes removing substrate at a first removal rate, wherein determining a reference concentration level includes determining a concentration level corresponding to a threshold level of substrate removal, and wherein controlling therefrom the substrate removal includes removing the substrate at a second removal rate.

10. The method of claim 9, wherein the threshold level corresponds to approaching the endpoint of the substrate removal process, and wherein controlling therefrom the substrate removal includes reducing the rate at which the substrate is removed.

11. The method of claim 8, wherein determining a reference concentration level includes determining a concentration level corresponding to an endpoint of the substrate removal process, and wherein controlling therefrom the substrate removal includes stopping the substrate removal.

12. The method of claim 3, further including providing a computer arrangement programmed to use the detected concentration level of the selected substrate material to control the rate of substrate removal.

13. The method of claim 3, controlling the substrate removal as a function of the detected concentration level of the selected substrate material comprises stopping substrate removal.

14. The method of claim 3, wherein removing a portion of substrate from the back side includes removing substrate at a first removal rate, and wherein controlling the substrate removal as a function of the detected concentration level of the selected substrate material comprises removing substrate at a second rate.

15. The method of claim 3, wherein detecting a concentration level of the selected substrate material as it is sputtered from the back side of the chip during substrate removal includes using secondary ion mass spectrometry (SIMS).

16. The method of claim 1, wherein removing a portion of substrate in the back side of the semiconductor chip as a function of a detected selected substrate material that is sputtered from a region of the substrate includes removing substrate for post-manufacturing analysis.

17. A method for removing substrate from a semiconductor chip having SOI structure and a back side opposite a circuit side, the method comprising the steps of:

(A) directing an ion beam at a portion of the substrate and sputtering ions from the substrate, thereby removing substrate from the back side of the semiconductor chip and forming an aperture in the back side;

(B) detecting the concentration of sputtered ions as the substrate is being removed;

(C) repeating steps A and B until the concentration of the detected sputtered ions reaches a threshold level;

(D) adjusting the substrate removal rate in response to reaching the threshold level;

(E) repeating steps A through D until a threshold level corresponding to the endpoint of the substrate removal process is detected; and (F) terminating the removal process in response to detecting the endpoint.

18. The method of claim 17, wherein directing an ion beam at a portion of the substrate and sputtering ions from the substrate has a time duration that is a function of the ion beam energy and the material being sputtered.

19. The method of claim 17, wherein adjusting the substrate removal rate comprises:

determining a reference concentration level of sputtered selected substrate material; and comparing the detected concentration of the sputtered ions to the reference concentration level and adjusting therefrom the substrate removal.

20. The method of claim 17, wherein the final endpoint corresponds to reaching the oxide layer of the SOI structure.

21. A system for removing substrate from a semiconductor chip having silicon-on-insulator (SOI) structure and a back side opposite a circuit side, the system comprising:

means for removing substrate from the back side of the semiconductor chip and forming an aperture;

means for detecting an emission of secondary ions from the back side, including ions from the insulating portion of the SOI structure, as the aperture is being formed; and means for controlling the means for removing substrate as a function of the detected secondary ion emission.

22. A system for removing substrate from a semiconductor chip having silicon-on-insulator (SOI) structure and a back side opposite a circuit side, the system comprising:

a substrate removal arrangement adapted to remove substrate from the back side of the semiconductor chip and form an aperture;

a detection device adapted to detect an emission of secondary ions from the back side, including ions from the insulating portion of the SOI structure, as the aperture is being formed; and a controller adapted to control the substrate removal arrangement as a function of the detected secondary ion emission.

23. The system of claim 22, wherein the substrate removal arrangement includes an ion beam generating device having a controller and adapted to direct an ion beam at the substrate and sputter secondary ions from the substrate.

24. The system of claim 23, wherein the controller is coupled to a computer arrangement adapted to provide a control signal to the controller.

25. The system of claim 24, wherein the substrate is removed at a removal rate, and wherein the control signal is used for controlling the removal rate.

26. The system of claim 23, wherein the ion beam generating device removes substrate at a rate that is a function of the ion beam energy and the substrate being removed.

27. The system of claim 23, wherein the controller is adapted to compare the concentration of the detected secondary ion emission to a reference concentration level and to control the substrate removal in response to the comparison.

28. The system of claim 27, wherein the controller is further adapted to determine the amount of substrate that has been removed in response to the comparison.

29. The system of claim 23, wherein the detection device includes a secondary ion mass spectrometer.

30. The system of claim 23, wherein the controller is adapted to stop the substrate removal arrangement in response to the detection of secondary ion emissions that include emissions from the insulating portion of the SOI.

* * * * *